United States Patent
Bhunia et al.

(10) Patent No.: US 11,549,897 B2
(45) Date of Patent: Jan. 10, 2023

(54) SYSTEM AND METHOD FOR HAND-HELD NQR-BASED IN-FIELD SCREENING OF SUBSTANCES

(71) Applicant: University of Florida Research Foundation, Inc., Gainesville, FL (US)

(72) Inventors: Swarup Bhunia, Gainesville, FL (US); Naren Vikram Raj Masna, Gainesville, FL (US); Soumyajit Mandal, Gainesville, FL (US); David Joseph Ariando, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 17/389,601

(22) Filed: Jul. 30, 2021

(65) Prior Publication Data
US 2022/0042938 A1 Feb. 10, 2022

Related U.S. Application Data (60) Provisional application No. 63/061,603, filed on Aug. 5, 2020.

(51) Int. Cl.
*G01N 24/08* (2006.01)
*G01R 33/44* (2006.01)

(52) U.S. Cl.
CPC ......... *G01N 24/087* (2013.01); *G01N 24/084* (2013.01); *G01R 33/441* (2013.01)

(58) Field of Classification Search
CPC ... G01N 24/087; G01N 24/084; G01R 33/441
See application file for complete search history.

(56) References Cited

U.S. PATENT DOCUMENTS

| 5,206,592 A * | 4/1993 | Buess | G01R 33/441 324/318 |
| 2020/0293730 A1* | 9/2020 | Bhunia | G07D 7/181 |

\* cited by examiner

*Primary Examiner* — G. M. A Hyder
(74) *Attorney, Agent, or Firm* — Thomas | Horstemeyer, LLP (57) ABSTRACT

An exemplary integrated nuclear quadrupole resonance-based detection system comprises a front-end device having a hand-held form factor, wherein the front-end device is configured to scan a sample in or near a sample coil using inbuild electronics and acquire a nuclear quadrupole resonance measurement. The system further includes a swappable sample coil that is attached to an opening at a face of the front-end device and is tuned to a resonant frequency of the sample; and a swappable impedance matching network that is attached to the opening at the face of the front-end device and is configured to tune the resonant frequency of the sample coil. The inbuild electronics comprises a wireless transfer module that is configured to communicate the acquired nuclear quadrupole resonance measurement with a back-end device of the integrated nuclear quadrupole resonance-based detection system. Other systems and methods are also provided.

20 Claims, 13 Drawing Sheets

SYSTEM AND METHOD FOR HAND-HELD NQR-BASED IN-FIELD SCREENING OF SUBSTANCES

CROSS-REFERENCE TO RELATED APPLICATION

This application claims priority to co-pending U.S. provisional application entitled, "System and Method for Hand-Held NQR-Based In-Field Screening of Substances," having Ser. No. 63/061,603, filed Aug. 5, 2020, which is entirely incorporated herein by reference.

STATEMENT REGARDING FEDERALLY SPONSORED RESEARCH OR DEVELOPMENT

This invention was made with government support under 1563924 awarded by the National Science Foundation. The Government has certain rights in the invention.

BACKGROUND

Consumers and law enforcement are equally concerned about the increase in adulterated consumables that are present in the market. In addition to counterfeited substances, authorities also have to deal with new illegal drugs. These drugs are imported into the country in various ways. Often, these substances are available in small quantities and require rapid detection in the field.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

The present disclosure describes various embodiments of integrated nuclear quadrupole resonance (iNQR) detection systems, apparatuses, and methods. An exemplary system is composed of a portable front-end device and a back-end device, such that the front-end device is configured to acquire NQR data of a sample that is positioned in/near a sample coil of the front-end device and to send the acquired NQR data to the back-end device that is configured to generate an NQR signature that is used as a basis for identification of the sample.

In brief, government agencies, such as the U.S. Customs and Border Protection (CBP) and Drug Enforcement Administration (DEA), need a significant amount of time to decide upon the identity and/or authenticity of captured substances, such as drugs or medicines. This process involves sample collection from suspect cargo, transportation to a central laboratory (lab), analysis using lab instruments, and finally a decision on the confiscated product. In most cases, synthetic opioids, illegal substances, and counterfeit drugs are detected using trained canines, which is effective but still leaves significant gaps in detection capabilities for criminals to exploit.

In accordance with embodiments of the present disclosure, products can be rapidly tested in the field using an exemplary portable (e.g., hand-held) iNQR detection device (front-end device) and data can be wirelessly sent to a back-end device in the lab. The latter can analyze the data and rapidly generate a report, thus saving significant time for government agencies tasked with identifying suspect products.

Figure 1A:
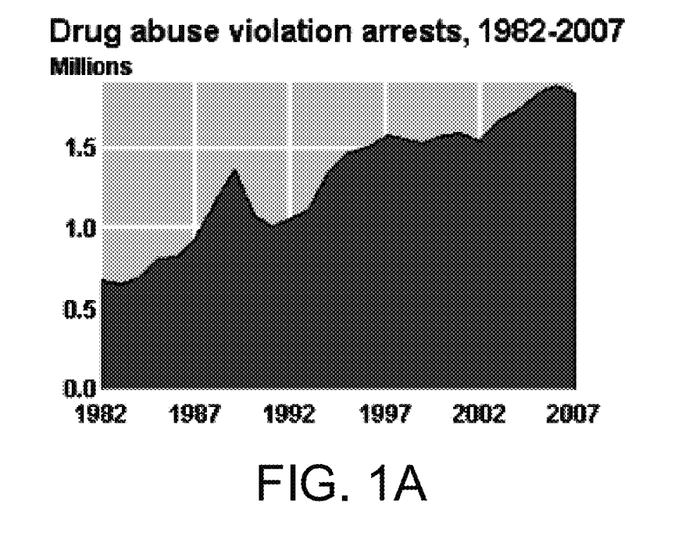
FIG. 1A provides a statistical chart showing a number of drug abuse violation arrests over a 25-year period.
Figure 1B:
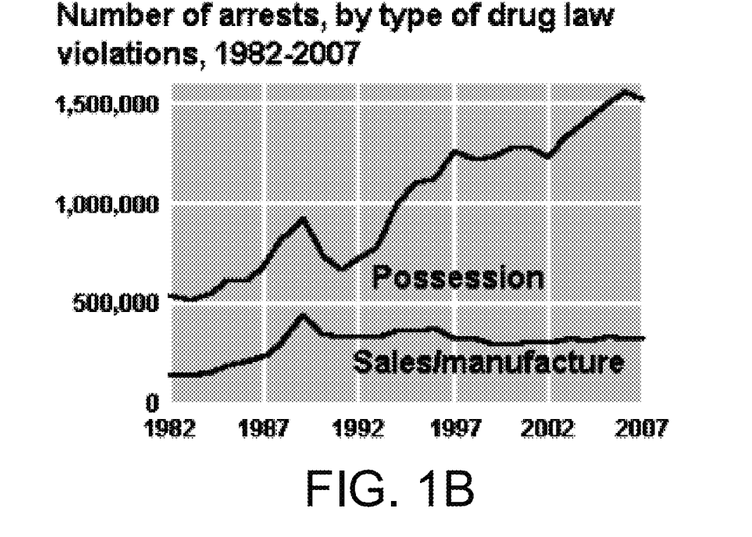
FIG. 1B provides a statistical chart showing a number of drug abuse violation arrests by the type of drug law violation over a 25-year period.
Figure 1C:
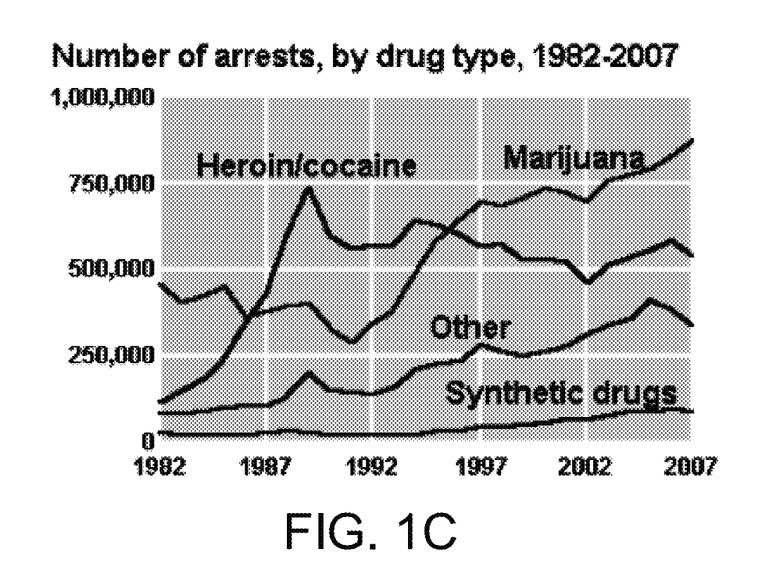
FIG. 1C provides a statistical chart showing a number of drug abuse violation arrests by the drug type over a 25-year period.
Figure 2:
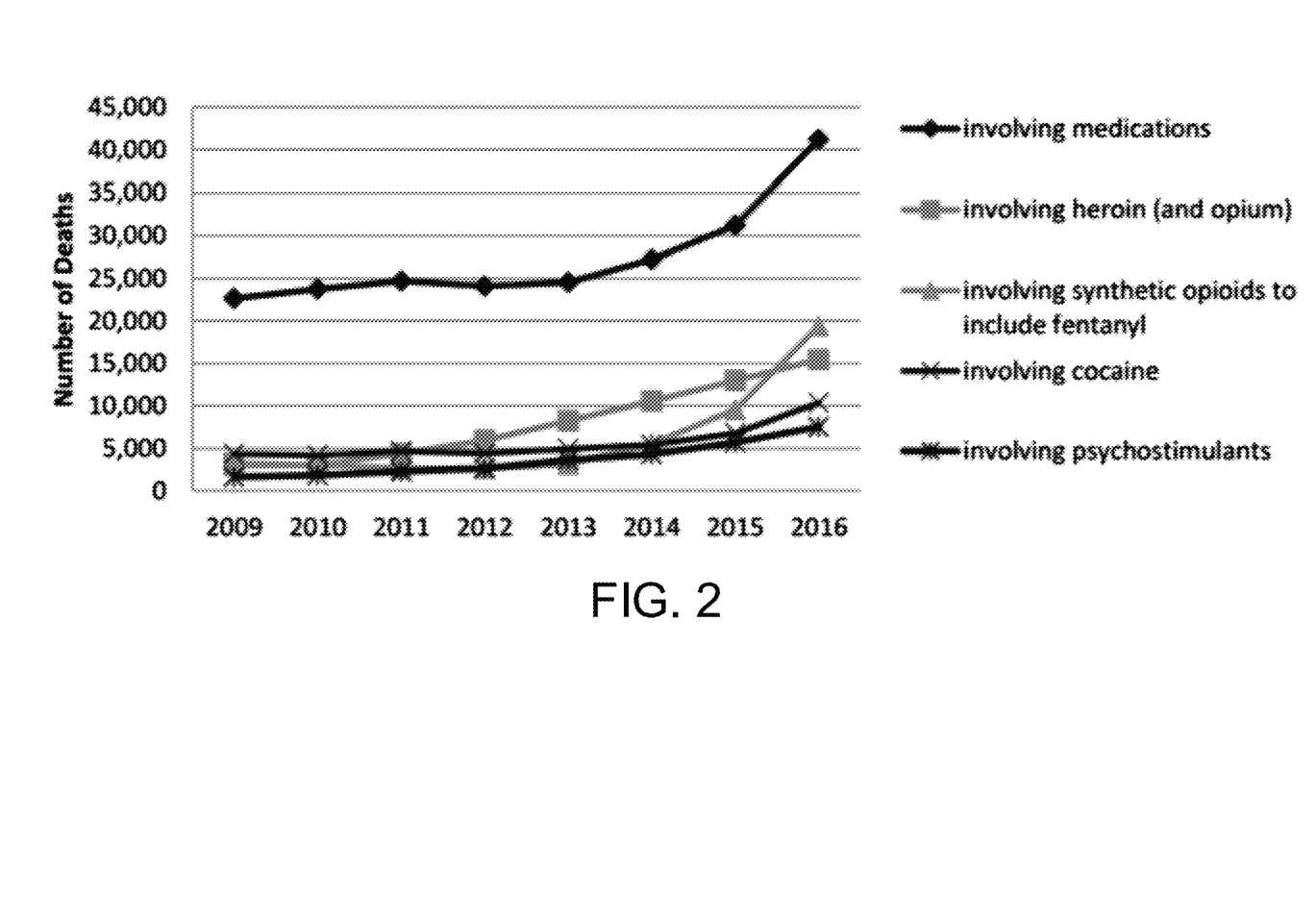
FIG. 2 provides a statistical chart showing a number of drug-related deaths occurring during a 7-year period.

Major product categories that are of interest to such agencies include controlled drugs such as synthetic opioids. There are an alarming number of deaths related to abuse of such drugs every year (e.g., due to overdoses), and the situation is growing worse. For example, according to Department of Justice Statistics, there has been a steady increase in all crimes related to drugs and medicines over the last 25 years. FIGS. 1A-1C show the rising rate of (A) drug abuse violation arrests; (B) drug abuse violation arrests by the type of drug law violation; and (C) drug abuse violation arrests by the drug type over a 25-year period. These findings are supported by data from the Drug Enforcement Administration (DEA), which also releases statistical evidence on the adverse effects of drugs and medicine abuse. For example, FIG. 2 shows the rising rate of drug-related deaths occurring during a 7-year period.

In addition to illegal drugs, there is also a growing illicit trade in prescription medicines that undermines attempts to ensure safe access to them. In particular, falsified or substandard medicines with altered or non-existent APIs (active pharmaceutical ingredients) are widespread in the pharmaceutical supply chain, particularly in low- and middle-income countries (LMICs) with weak pharmacovigilance and drug regulatory systems. Globally, antimicrobials and antimalarials are two of the classes of medicines most targeted by counterfeiters.

In a prior version of a Nuclear Quadrupole Resonance (NQR)-based detection system, we introduced an authentication model based on using 14N Nuclear Quadrupole Resonance (NQR) for identifying the legitimacy of consumables. NQR has recently been established as a powerful tool in pharmaceutical authentication. The technique is of interest because the 14N nucleus is quadrupole active, has almost 100% natural abundance, and is present in most of the drug and supplement products on the market. We have also used other quadrupolar nuclei, notably 35Cl, for authentication of such products. In either case, NQR resonance frequencies are highly dependent on molecular geometry and crystal structure. As a result, even closely-related molecules generally have widely-separated NQR lines (that can be used as an NQR signature), which improves the specificity of the chemical analysis, i.e., increases the confidence with which samples can be identified and the contents of mixtures quantified. Besides, a single-point calibration with a known sample is sufficient for quantitative NQR measurements without any sample preparation, i.e., for accurate quantification of the total amount of a given active ingredient.

Figure 3A:
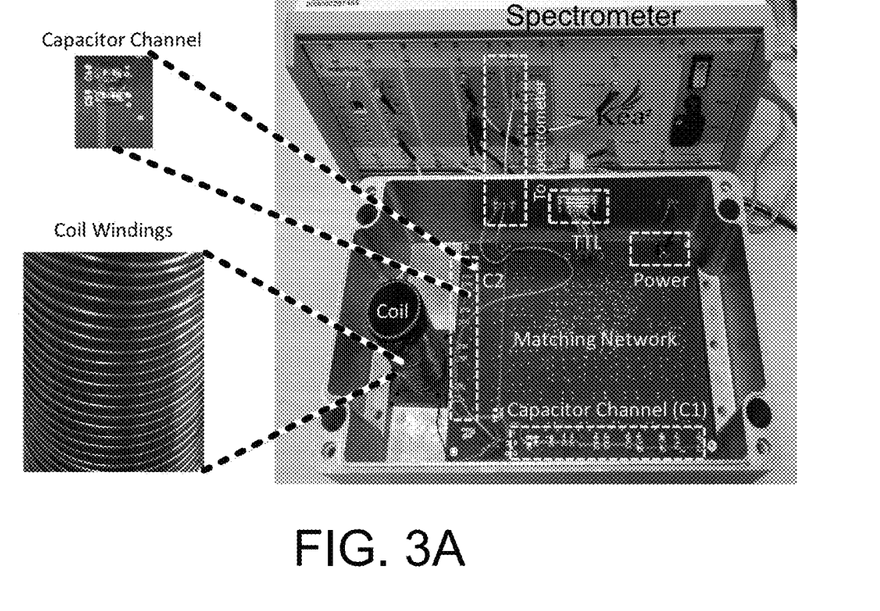
FIGS. 3A-3B show an image of an existing benchtop Nuclear Quadrupole Resonance (NQR)-based detection system and a block diagram of the NQR-based detection system, respectively.
Figure 3B:
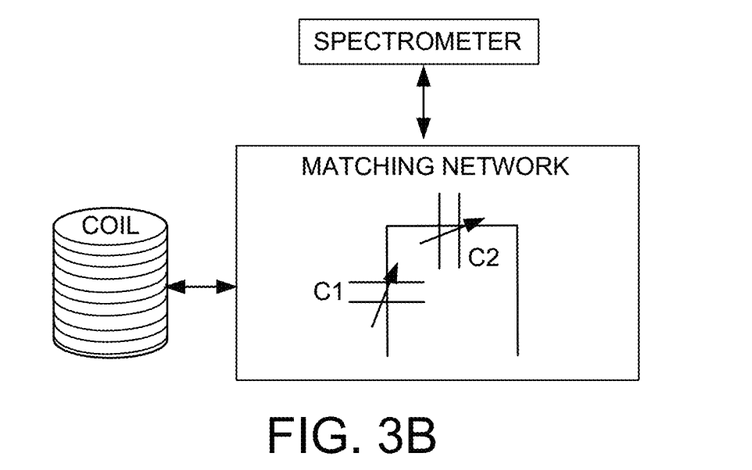

An early version of a NQR-based detection system is a benchtop setup (FIGS. 3A-3B) that is based upon a commercially-available spectrometer (Magritek Kea2) that includes both an analog front-end (e.g., transmitter, low-noise receiver, and duplexer) and a digital signal processor (DSP). The spectrometer is connected to an external computer (e.g., laptop) to acquire data and display the results. In practice, a sample is placed within a coil or detector component of the analog front end prior to analysis.

In a subsequent version of the NQR-based detection system, functions of the external spectrometer are carried out by a custom analog front-end that contains two printed circuit boards (PCBs). In turn, the PCBs are optimized to work in combination with a low-cost System-on-Chip (SoC) development board that acts as the primary system controller in place of an external computer, such that the SoC contains an embedded processor that runs an operating system (Linux) and is used for on-board data processing, thereby eliminating the need for an external computer. The system can be connected to the cloud (e.g., network accessible storage server or data center) to share data by using a USB Wi-Fi module.

In accordance with various embodiments of the present disclosure, the analog front-end is improved and made independent of a digital back-end (DSP and computer) for integrated nuclear quadrupole resonance (iNQR) detection systems. This change helps in miniaturizing the front-end into a hand-held form factor that is physically separate from the back-end component, making it easy to carry and use in the field. As such, a user on the field can control the front-end. The data collected by the front-end can be transmitted to the back-end to process & analyze the data.

Figure 4:
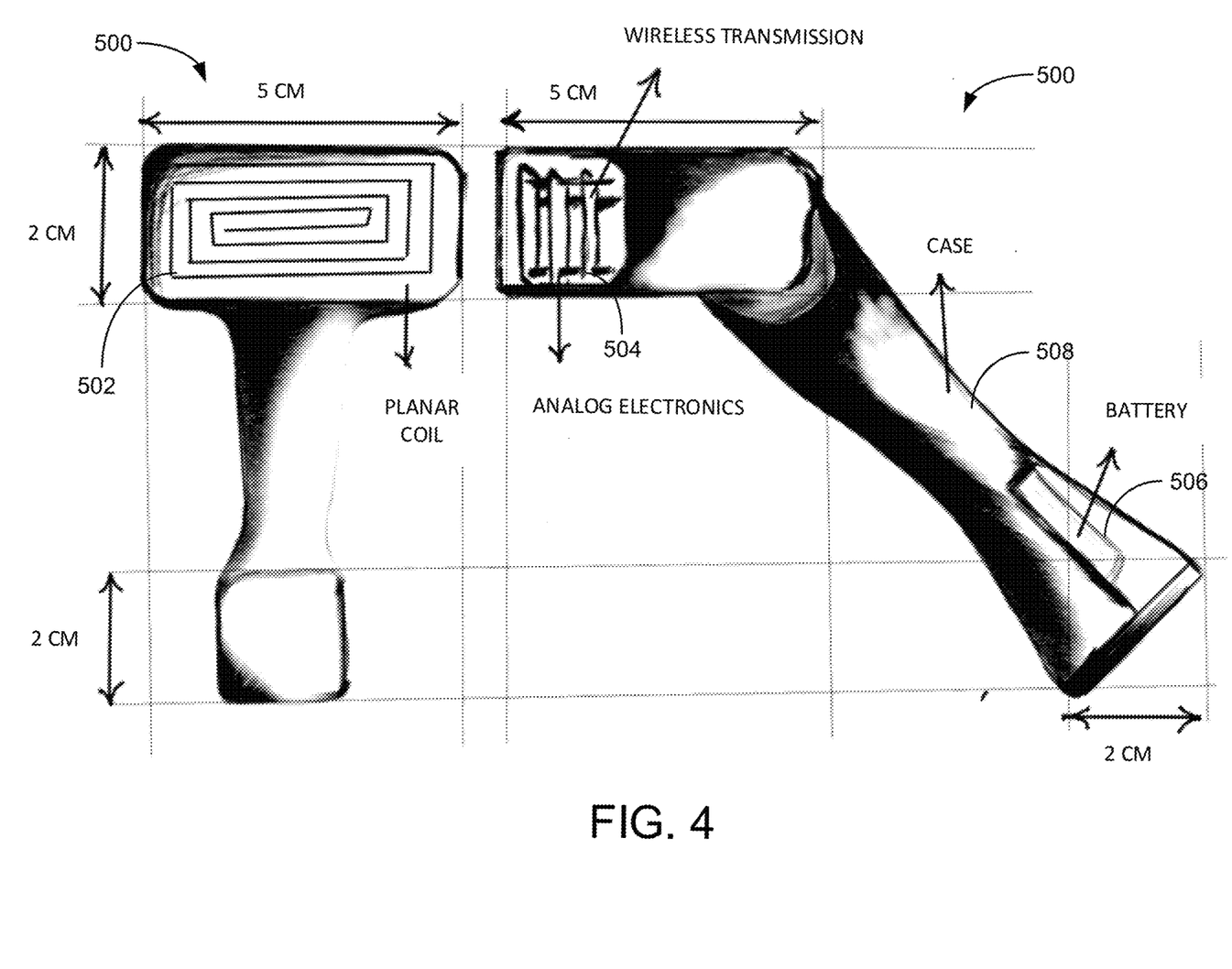
FIG. 4 is a drawing of an exemplary front-end component of a portable integrated NQR (iNQR) detection system in accordance with various embodiments of the present disclosure.

FIG. 4 is a drawing of an exemplary front-end component 500 of a hand-held iNQR detection system in accordance with various embodiments of the present disclosure. The left side of the figure shows a front view of the front-end and the right side of the figure shows a side view of the front-end of the hand-held iNQR detection system. In one embodiment, the front-end 500 contains a detector or sample coil 502 (which can have a cylindrical, U-shaped, or planar geometry). As can be seen in FIG. 4, the front end contains analog electronics or circuitry 504 that can include an impedance matching network, a miniaturized transmitter, a low-noise preamplifier, a duplexer, analog-to-digital and digital-to-analog converters (ADCs and DACs, respectively), encryptors and decryptors, a wireless or wired data transfer module, and a power pack (batteries) 506. Most of these blocks/components (apart from the coil and matching network) can be integrated within a single custom application-specific integrated circuit (ASIC) to minimize size, weight, and power consumption. FIG. 4 shows the circuitry components of the front-end being at least partially encased in a protective case or shell 508. In one embodiment, the coil and analog electronics are partially encased by a 2 cm×5 cm×5 cm enclosure. However, the dimensions of alternative embodiments of the hand-held front-end are not limited to those depicted in FIG. 4 and can be made larger or smaller.

In accordance with various embodiments, an exemplary front-end design is configured to transmit its acquired data to a back-end component. Such data transmission can be via wireless or wired communications. Accordingly, in various embodiments, an exemplary back-end contains a wireless data transfer module, encryptors, decryptors, computational blocks, machine learning (ML) blocks, and memory for storing chemical NQR signatures and related information from a database.

A primary function of the front-end device of an exemplary system is to collect NQR data from the samples obtained in the field. Maximizing the detection sensitivity requires the data to be collected using a detector (sample coil) that is tuned to the sample's resonant frequency. In various embodiments, a digitally-programmable impedance matching network is used to tune the resonant frequency of the coil from 1.5 MHz to 3 MHz for 14N NQR measurements. A similar but separate network is used to tune over a higher-frequency range (20-35 MHz) for 35Cl NQR, in various embodiments.

In some embodiments and in earlier versions of NQR-based detection systems, a non-resonant (broadband) matching network has been successfully used to replace such tunable narrowband impedance matching networks for NQR. Such non-resonant probes eliminate the need for tuning the coil, thus simplifying the measurement and calibration procedure. However, they are also completely impedance-mismatched, so almost all the power delivered by the transmitter is reflected from the coil instead of being absorbed. Hence, the supply voltage has to be significantly larger than for a tuned probe to deliver the same current to the coil which makes it difficult to run the system off batteries, which are preferable for their low noise and portability. Moreover, the probe is also impedance-mismatched during reception, which makes it necessary to use an ultra-low-noise preamplifier to obtain an acceptable noise figure (NF).

Thus, an exemplary embodiment of the iNQR detection system uses a digitally-programmable impedance matching network, which provides benefits of a truly broadband network without the attendant disadvantages. In particular, a two-capacitor impedance matching network, either in a series-parallel or parallel-series configuration depending on the size and inductance of the sample coil, is used in various embodiments of the iNQR detection system. The efficiency ($\eta$) of the impedance matching network is defined as the ratio of power delivered to the coil to total input power and can be written as a function of frequency, as shown in Equation (1), and should be as close to 100% as possible:

$$\eta(f) = P_{coil}(f)/P_{in}(f) \text{ tm (1)}$$

Besides, the input impedance ($Z_{in}$) of the network (which is presently assumed to be in the parallel-series configuration for simplicity) is given by:

$$Z_{in}(\omega) = \frac{1}{j\omega C_2} + \frac{(j\omega L + R)}{(1 - \omega^2 LC_1) + j\omega RC_1}, \quad (2)$$

where $C_1$ is the capacitor in parallel with the coil, $C_2$ is the capacitor in series with the coil, and L and R are the inductance and resistance of the coil, respectively. Equation (2) (above) shows that the impedance does not increase monotonically with frequency. In practice, the values of $C_1$ and $C_2$ are programmed to ensure an impedance match (Re($Z_{in}$)=50 Ω, Im($Z_{in}$)=0) at the desired operating frequency.

Figure 5:
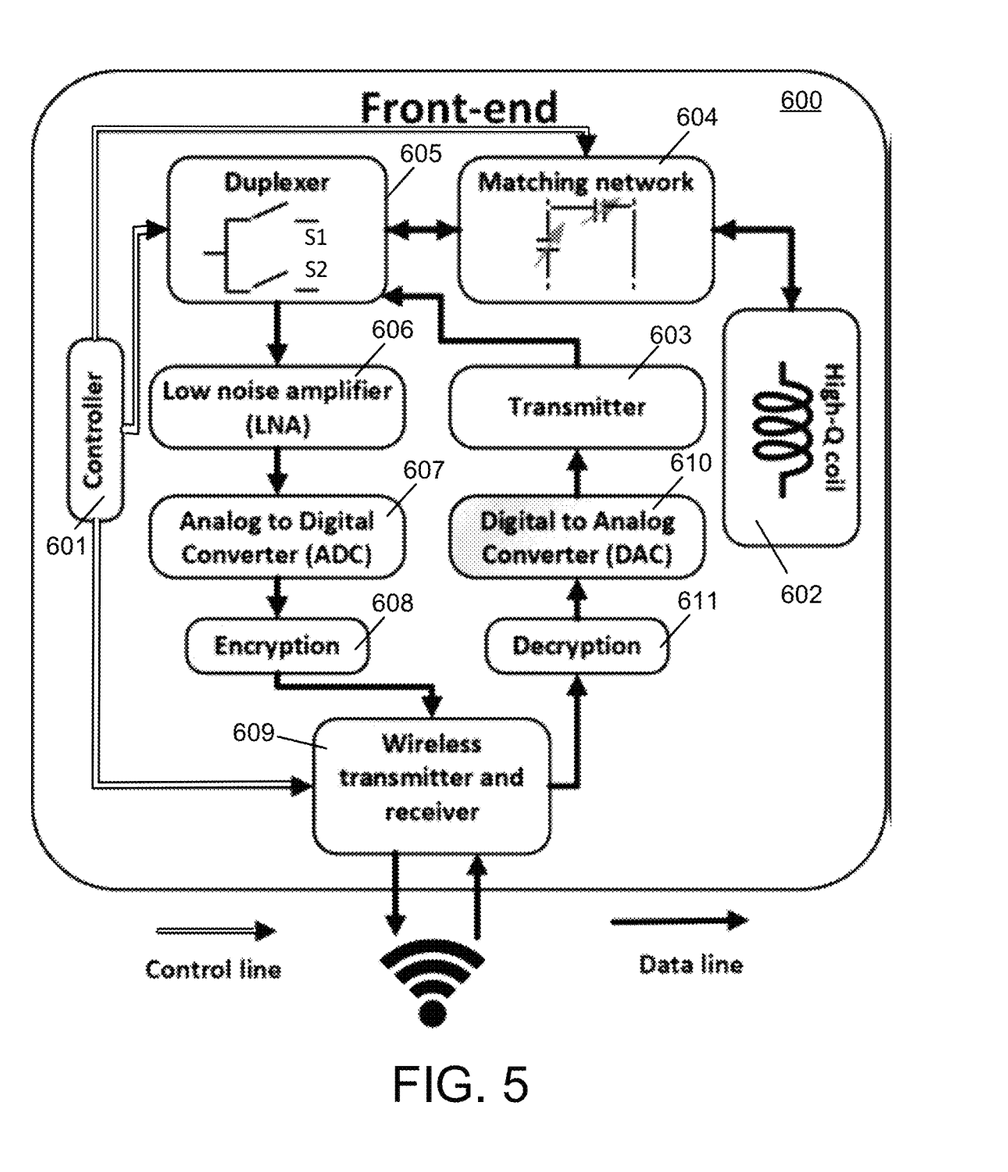
FIG. 5 shows a block diagram of an exemplary front-end device for a hand-held iNQR detection system in accordance with various embodiments of the present disclosure.

FIG. 5 shows a block diagram of an exemplary front-end device (front-end) 600 for a hand-held iNQR detection system in accordance with various embodiments of the present disclosure. The front-end is autonomous and independent of a back-end component of an exemplary iNQR detection system. As can be seen in FIG. 5, the coil 602 acts as both a transmitter and a receiver. Capacitors in the matching network 604 ensure that the coil 602 is impedance-matched at the desired operating frequency, as described earlier. The duplexer 605 controls the transition of the coil 602 between the two modes: transmission and reception, as commanded by a controller component 601. The duplexer 605 used in this exemplary system is based on a well-known passive "lumped" design, and the circuit has a low quality factor (Q), thus providing sufficient bandwidth and eliminating the need for digital tuning. An exemplary transmitter design 603 uses a custom class-A push-pull linear power amplifier with differential inputs and a single-ended output. The design allows the user to select between two output stages with different power handling capabilities (e.g., 2.5 W up to 40 MHz, 10.6 W up to 11.6 MHz, etc.). The input can be driven by either (i) two complementary digital signals (differential square waves), thus avoiding the need for a high-speed DAC but making control of the output power level more difficult; or (ii) an analog signal generated by a DAC 610, thus allowing the output power level to be easily adjusted. In the former case, the square waves are filtered using a multiple-feedback differential low-pass filter. This approach requires the low-pass filter to be programmable to operate over broad frequency ranges, as required for an autonomous NQR system. Switched resistors or digitally-controlled potentiometers can be used for such software-controlled tuning.

The measurement sequence (known as a pulse program and in the form of an alternating series of transmit and receive phases) is controlled from the back-end device. The data collected while in the receiving mode is analog, which is challenging to transfer wirelessly without degradation. Thus, it is amplified and digitized prior to transmission (via low noise amplifier (LNA) 606 and ADC 607), and, for security reasons, the digital data is encrypted (via encryption element 608) before being wirelessly transferred to the back-end via element 609. Correspondingly, the measurement control data that is received from the back-end component is decrypted via a decryption component 611 before being converted to analog data and processed.

Figure 6:
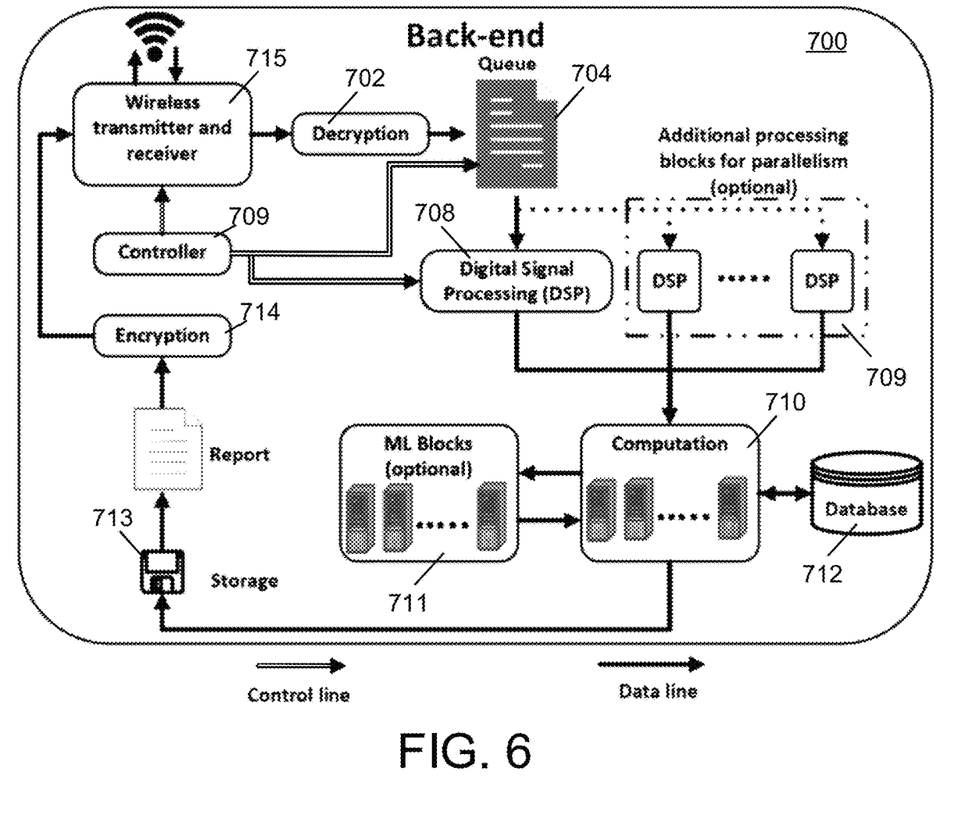
FIG. 6 is a block diagram of an exemplary back-end device for a hand-held iNQR detection system, which can support multiple autonomous front-end devices, in accordance with various embodiments of the present disclosure.

FIG. 6 is a block diagram of an exemplary back-end device (back-end) 700 for a hand-held iNQR detection system, in accordance with various embodiments of the present disclosure. As discussed, the back-end 700 receives digitized data from the front-end 600 (FIG. 5). The back-end 700 has the ability to handle data from multiple front-ends 600. Received data is decrypted 702 and inserted into a queue 704 for analysis. Data in the queue 704 is scheduled for processing (via a digital signal processor (DSP) 708) as computational resources 710 become available in a back-end processor/controller. In various embodiments, the back-end component 700 can collect and analyze data from multiple samples at a time via parallel DSP units 709.

In various embodiments, the processed data is fed to high-level language programs running in the main processor that extract NQR features. The speed of operation depend on the resources utilized, such as optional machine learning (ML) models or blocks 711. The NQR features are compared with stored NQR signatures (from a database 712) to make a decision (e.g., generate a classification result or report) on the nature of the substance tested. The results of the test are saved/stored (713) and encrypted (714). The wireless module 715 is used to securely transfer the encrypted data—either to the user via a mobile application or to a cloud server for storage and later analysis.

Figure 7:
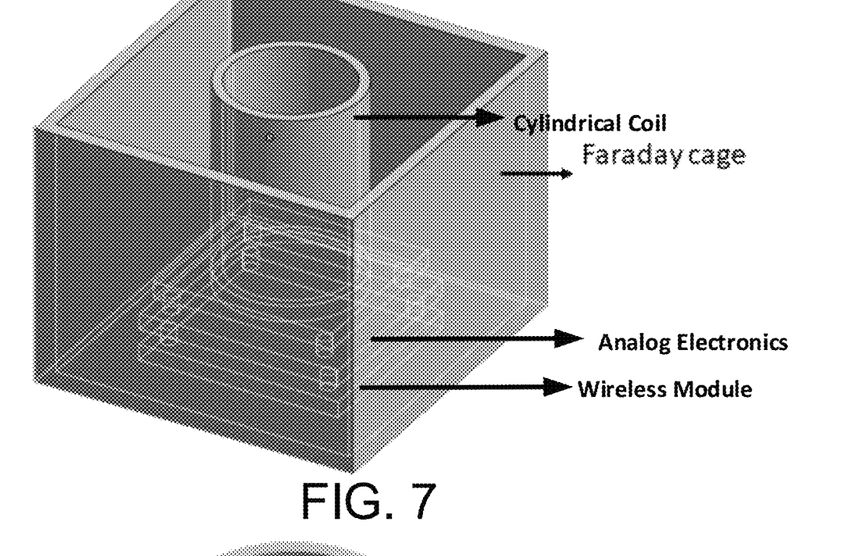
FIG. 7 shows a prototype model of a Faraday cage and cylindrical coil in accordance with various embodiments of the present disclosure.

In various embodiments, different types of NQR front-ends can be deployed. As a point of reference, a portable (but not hand-held) NQR-based detection system may feature a cylindrical coil (solenoid) placed inside a Faraday cage for radio frequency (RF) shielding. This geometry is suitable for analyzing small samples that can be directly placed within the solenoid. FIG. 7 shows an exemplary illustration of the Faraday cage and cylindrical coil geometry. This design is similar to earlier NQR-based system setups (benchtop and portable), but with the front-end and back-end physically separated to allow easy deployment of multiple detector units (front-ends) within a facility (e.g., a large pharmacy or laboratory). Since the front-end modules are approximately the same size as the coil base, all the parts can be stacked on top of each other to make a portable setup, as can be seen in FIG. 7. The entire setup is enclosed within a Faraday cage (e.g., an aluminum box) for shielding, since NQR measurements are sensitive to radio-frequency interference (RFI).

Figure 8:
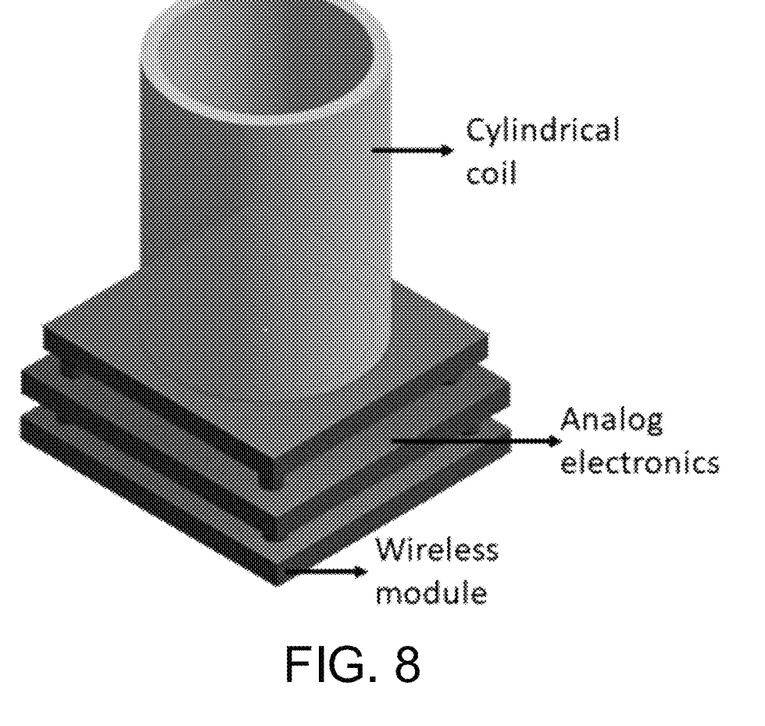
FIG. 8 shows a prototype model of a cylindrical coil in accordance with various embodiments of the present disclosure.

A hand-held iNQR detection system may feature a similar cylindrical coil as FIG. 7, but without the Faraday cage to reduce overall size and weight. FIG. 8 shows an exemplary illustration of the cylindrical coil geometry. Instead of the Faraday cage, active noise cancellation (ANC) techniques can be used to reduce unwanted RF interference (RFI) from external sources. Further, there may be multiple different types of iNQR front-ends in the hand-held form factor for an embodiment of the iNQR detection system, in which each front-end uses a different type of sample coil, but all can be interfaced with the same back-end. Thus, one can easily switch between different front-ends to realize "plug and play" analysis of a wide range of sample geometries.

Figure 9A:
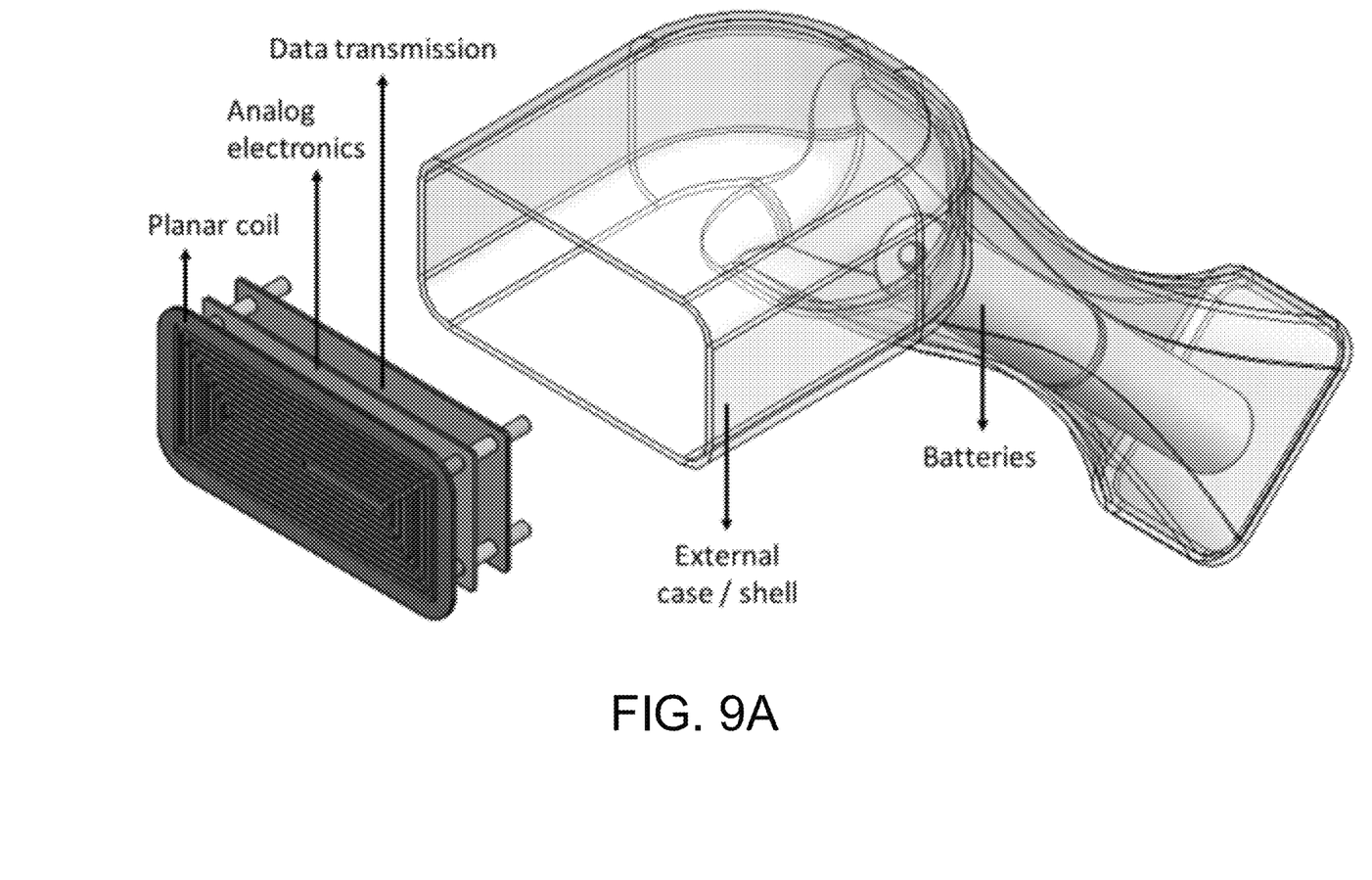
FIG. 9A shows a prototype model of an exemplary front-end device for a hand-held iNQR detection system using a planar coil in accordance with various embodiments of the present disclosure.

Correspondingly, an exemplary embodiment of a hand-held iNQR detection system may feature a planar coil. This geometry is suitable for analyzing large samples with a roughly planar geometry (e.g., mail packages). FIG. 9A shows an exemplary illustration of the planar coil geometry as a component of an exemplary hand-held iNQR front-end assembly.

Figure 9B:
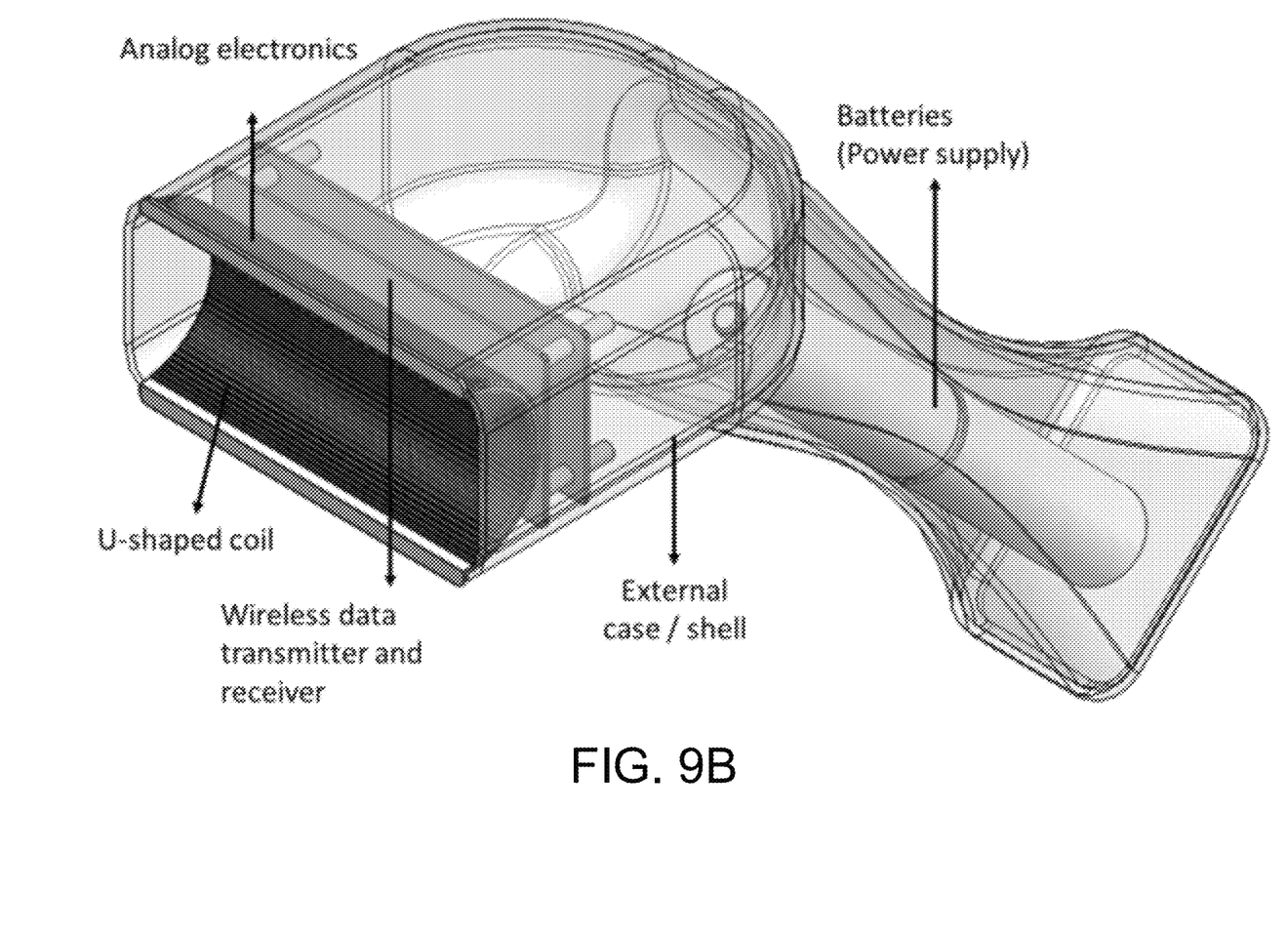
FIG. 9B shows a prototype model of an exemplary front-end device for a hand-held iNQR detection system using a U-shaped coil in accordance with various embodiments of the present disclosure.

Additionally, an exemplary hand-held iNQR detection system may feature a U-shaped coil. This geometry is suitable for analyzing samples that are large along a single dimension, such as rods and tubes. FIG. 9B shows an exemplary illustration of the U-shaped coil geometry as a component of an exemplary hand-held iNQR front-end assembly.

In the hand-held designs, each autonomous front-end can be miniaturized into a hand-held from factor by (i) integrating analog electronics within a single custom ASIC; and (ii) replacing the Faraday cage with an ANC algorithm. The coil, matching network, ASIC board (containing the transmitter, preamplifier, duplexer, and data converters), and wireless data transmission and reception module are carefully arranged to minimize system volume, as shown in FIGS. 9A-9B for the planar coil and U-shaped coil arrangements, respectively. In both cases, the coil makes up the face of the hand-held device while the electronics can be stacked behind it. Moreover, the coil and matching network can be designed to be "hot-swappable" with other versions (that have different sizes or resonant frequencies) based on the sample and nucleus under test.

The three different types of coil available for the hand-held system (planar, U-shaped, and cylindrical) each has their own pros and cons. The planar coil can be used on approximately planar samples of various sizes, much like an optical bar-code reader. The U-shaped and cylindrical (or circular) coils are limited to analyzing smaller samples that can be either partially- or fully-enclosed within the coil, respectively. On the other hand, due to these physical constraints, the sensitivity of U-shaped and cylindrical/circular coils is significantly larger than for planar coils. Thus, the planar coil requires more signal averaging to provide an NQR signature of similar quality (as quantified, for example, using signal-to-noise ratio (SNR)), thus resulting in a slower measurement. A detailed comparison is shown in Table 1 (below).

TABLE 1

| Type | Planar | U-Shaped | Cylindrical |
|---|---|---|---|
| Sensitivity | Low | Medium | High |
| Surface Area | Less | Relatively More | More |
| Speed | Relatively Slow | Relatively Fast | Fast |
| Size | Small | Small | Relatively Larger |
| Cost | Low | Low | Low |

In various embodiments, the front-end designs considered above transmit their acquired data to a nearby back-end. Such data transmission can take one of two forms: (1) Wireless (e.g., Wi-Fi, Bluetooth, etc.) and (2) Wired (USB, Ethernet cable, etc.).

One exemplary approach is for the front-end to connect via a wireless network. In an exemplary case, the data transmission relies on either Wi-Fi or Bluetooth. If a wireless connection is not feasible (e.g., due to high power consumption), a wired connection can be established using a USB (Universal Serial Bus), Ethernet cable, etc. In various embodiments, a wired connection would remove the need for the wireless module inside the hand-held front-end. Instead, data may be securely transmitted to a laptop, which then connects to the cloud (e.g., network accessible storage server or data center) over a wireless network.

Existing NQR technologies use instrumentation with single processing capabilities, i.e., they can analyze only one sample at a time. By contrast, an exemplary hand-held iNQR detection system, in accordance with various embodiments of the present disclosure, allows multiple independent front-ends to connect to a common back-end and can collect and analyze data from multiple samples at a time. The parallelism and speed of operation depend on the requirements of the end user (which can be a government entity or a private company, among others), since increased speed requires expensive resources like processors and machine learning (ML) blocks/devices.

Figure 10:
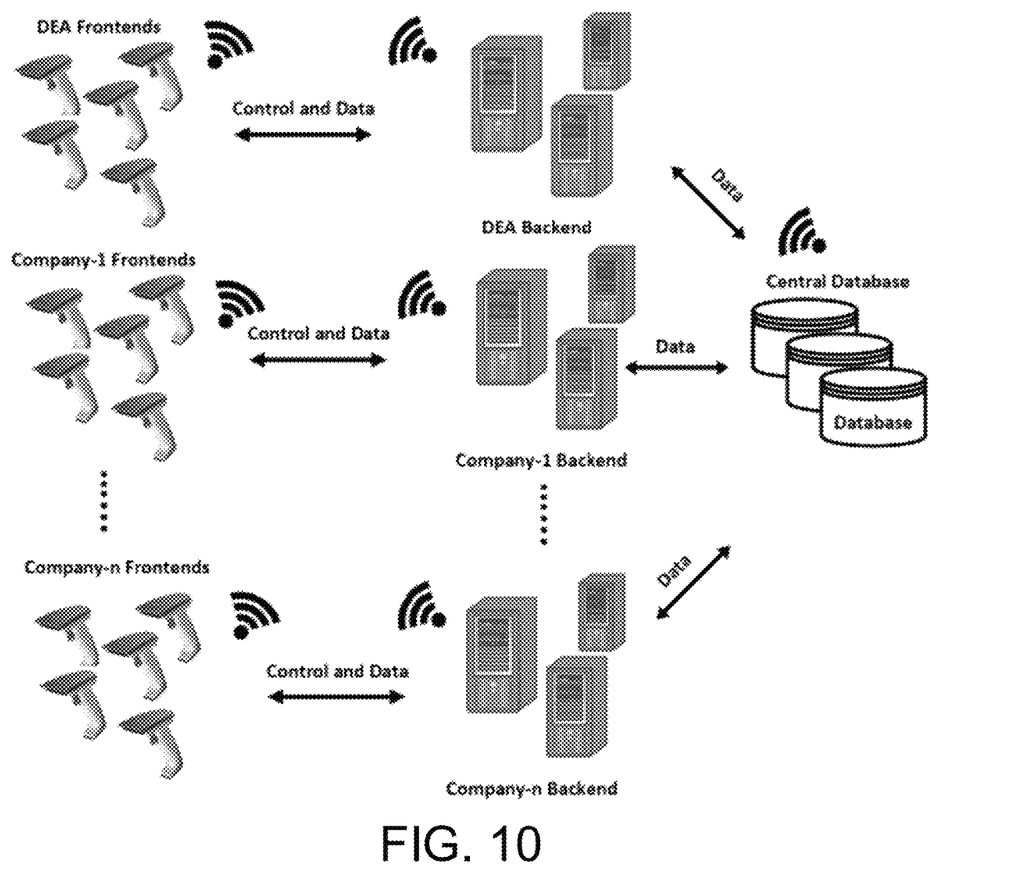
FIG. 10 shows an exemplary hand-held iNQR detection ecosystem in accordance with various embodiments of the present disclosure.

As can be seen in FIG. 10, an exemplary iNQR detection ecosystem may contain a large number of front-ends that interact with a smaller number of associated back-ends. As such, in various embodiments, an end user can have their own set of back-ends, each of which has secure wireless access to a database (e.g., central database) of iNQR signatures. Accordingly, the user can deploy multiple front-ends in the field, each of which connects securely to its associated back-end for data acquisition and analysis.

Figure 11A:
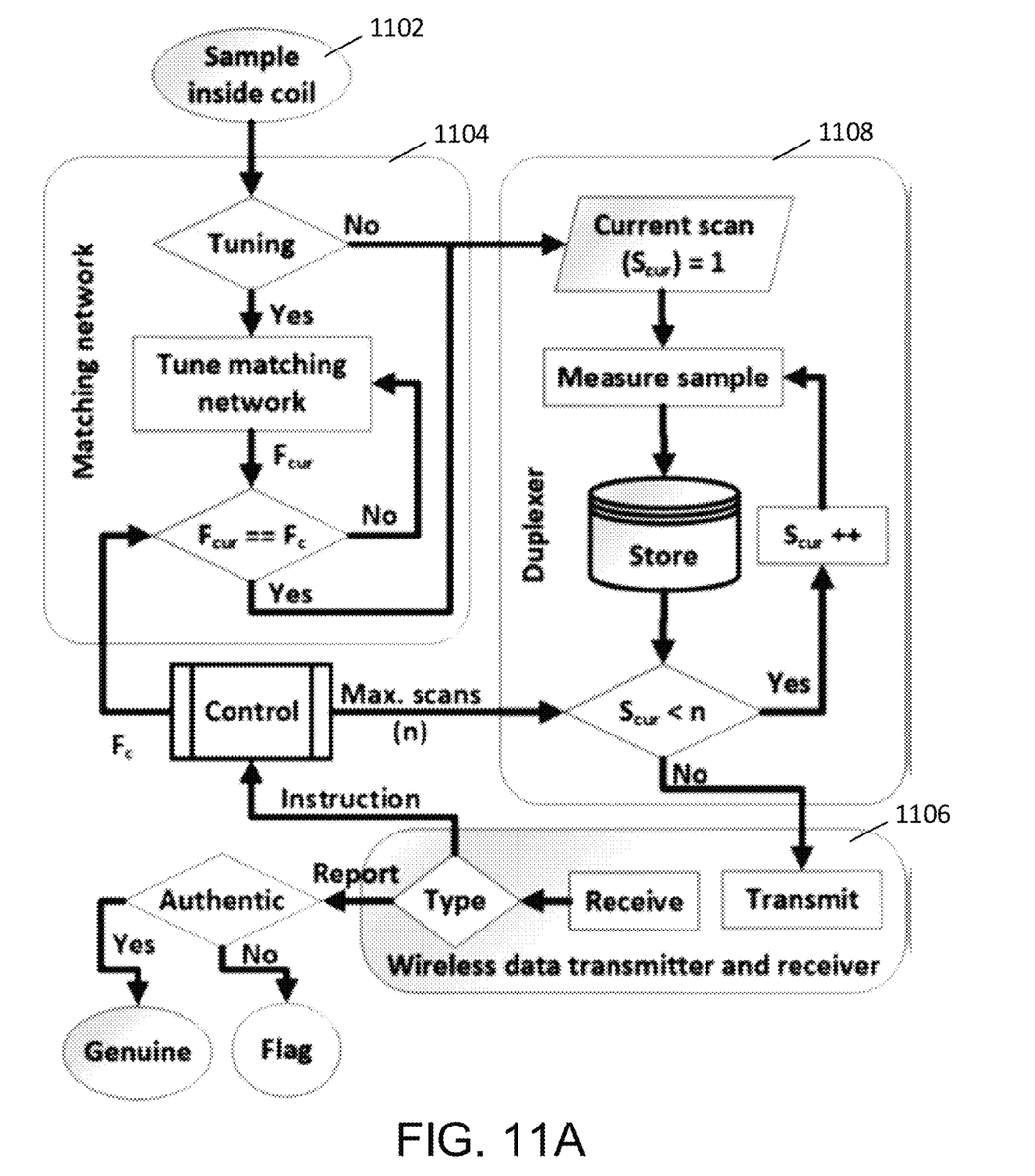
FIGS. 11A-11B are functional operational flowcharts of (A) the front-end device and (B) the back-end device of an exemplary hand-held iNQR detection system in accordance with various embodiments of the present disclosure.
Figure 11B:
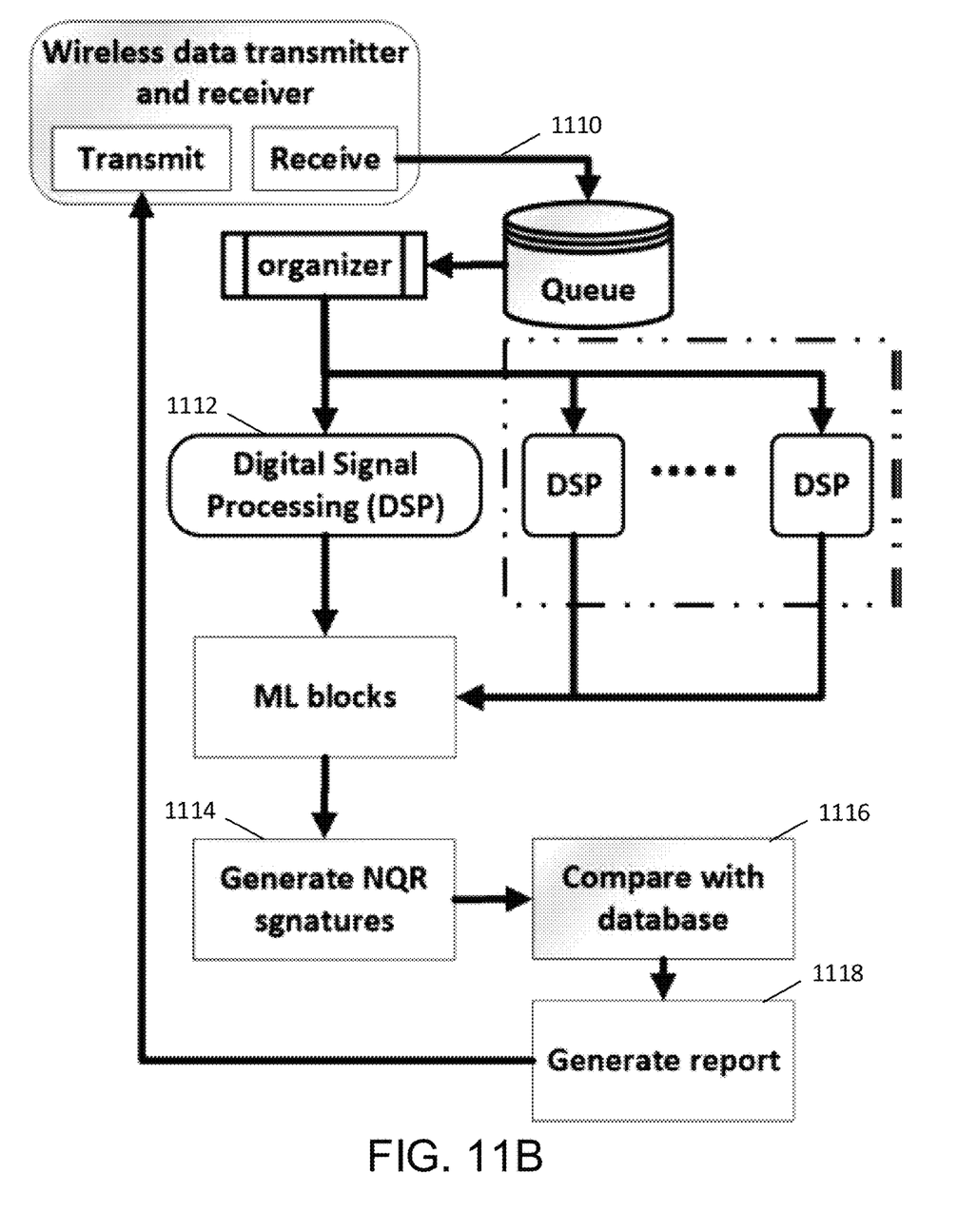

FIGS. 11A-11B are flow diagrams summarizing the functionality of an exemplary embodiment of a hand-held front-end for an exemplary iNQR detection system. As represented in the diagram, a sample 1102 under test can be positioned inside the coil and scanned using the front-end, which collects data using the inbuilt electronics (e.g., matching network 1104, transmitter 1106, preamplifier, duplexer 1108, and data converters). The matching network 1104 is configured to adjust the coil's resonant frequency to match the sample's resonant frequency, where the duplexer 1108 and related circuitry is configured to scan and acquire nuclear quadrupole resonance measurements of the sample. Certain operations can be initiated by the back-end via control instructions that are received by the front-end device from the back-end device. The collected data is wirelessly transferred (1110) to the associated back-end and processed in the built-in DSP 1112 to generate NQR signatures 1114. These signatures are compared with a central database 1116 of NQR signatures to generate a test report 1118. The latter is transferred to either the front-end or a mobile application for display and browsing by the human operator. In particular, the report can confirm the genuineness of the sample (if found to be authentic) or raise a warning flag (if found to be counterfeit).

In brief, the present disclosure describes various embodiments of a novel authentication device known as "iNQR" that uses nuclear quadrupole resonance (NQR) spectroscopy to verify the identity of a wide variety of high-value-added items, including pharmaceuticals, dietary supplements, food items, and branded products. Innovations of the present disclosure include that an exemplary system has the smallest (hand-held) form-factor to date of any iNQR-based chemical analyzer; an exemplary iNQR detection system is divided into two autonomous components: a front-end and a back-end; an exemplary autonomous front-end is low cost and contains replaceable parts; the novel architecture makes the entire testing process easier by keeping the front-end lightweight, low-cost, and easy-to-use; an exemplary detector (sample coil) used by the hand-held iNQR front-end can be "hot-swapped" by the end-user with coils of various sizes and geometries; a matching network of an exemplary hand-held iNQR front-end can be "hot-swapped" by the end-user with networks of various tuning frequency ranges, tuning speeds, and power-handling levels; an exemplary front-end is autonomous and self-contained; an exemplary front-end is powered using rechargeable batteries; multiple front-ends can be associated with a single back-end (that is connected to the cloud (e.g., network accessible storage server or data center) to process multiple samples in parallel; an exemplary back-end can process the data transmitted from multiple front-ends using parallelized algorithms and a queueing mechanism; and such technology can significantly empower both the consumer and law enforcement agencies, among others.

As such, in accordance with various embodiments of the present disclosure, an exemplary hand-held iNQR detection system enables faster authentication of food, drugs, medicines, and dietary supplements in the field. Moreover, the front-end uses easily-swappable parts that allow the user to test multiple nuclei and sample geometries in various applications with the same device, thus greatly lowering both capital and operating costs.

It should be emphasized that the above-described embodiments are merely possible examples of implementations, merely set forth for a clear understanding of the principles of the present disclosure. Many variations and modifications may be made to the above-described embodiment(s) without departing substantially from the principles of the present disclosure. All such modifications and variations are intended to be included herein within the scope of this disclosure.

Therefore, at least the following is claimed:

1. An integrated nuclear quadrupole resonance-based detection system comprising:
    a front-end device having a hand-held form factor, wherein the front-end device is configured to scan a sample in or near a sample coil using inbuild electronics and acquire a nuclear quadrupole resonance measurement,
    a swappable sample coil that is attached to an opening at a face of the front-end device and is tuned to a resonant frequency of the sample; and
    a swappable impedance matching network that is attached to the opening at the face of the front-end device and is configured to tune the resonant frequency of the sample coil,
    wherein the inbuild electronics comprises a wireless transfer module that is configured to communicate the acquired nuclear quadrupole resonance measurement with a back-end device of the integrated nuclear quadrupole resonance-based detection system.

2. The system of claim 1, wherein the swappable sample coil comprises a cylindrical coil without a Faraday cage and the inbuild electronics comprises active noise cancellation circuitry to reduce unwanted radio frequency (RF) interference.

3. The system of claim 1, wherein the swappable sample coil comprises a planar coil.

4. The system of claim 1, wherein the swappable sample coil is tuned over 1.5 MHz to 3 MHz for 14N nuclear quadrupole resonance measurements.

5. The system of claim 1, wherein the swappable sample coil is tuned over 20 MHz to 35 MHz for 35Cl nuclear quadrupole resonance measurements.

6. The system of claim 1, wherein the inbuild electronics comprise at least the impedance matching network, the wireless transfer module, a transmitter, a preamplifier, a duplexer, an analog to digital converter, and a digital to analog converter, wherein the inbuild electronics are integrated within a single custom application-specific integrated circuit.

7. The system of claim 1, further comprising the back-end device, wherein the back-end device is physically separate from the front-end device.

8. The system of claim 7, wherein the back-end device is configured to wirelessly receive the nuclear quadrupole resonance measurement for the sample and generate a nuclear quadrupole resonance signature for the sample from the nuclear quadrupole resonance measurement.

9. The system of claim 8, wherein the back-end device is further configured to compare the nuclear quadrupole resonance signature of the sample with nuclear quadrupole resonance signatures of known chemicals and generate a test report based on the comparison.

10. A method comprising:
    providing the front-end device of claim 1;
    selecting the swappable sample coil based on a size of the sample to be scanned, wherein a planar coil is selected for a sample having a planar geometry; a cylindrical coil is selected for a sample that can fit in a center space of the cylindrical coil; and a U-shaped coil is selected for a sample that has a length that is longer than a width of the sample;
    scanning the sample to acquire the nuclear quadrupole resonance measurement; and
    transmitting the nuclear quadrupole resonance measurement to the back-end device.

11. The method of claim 10, further comprising:
    generating a nuclear quadrupole resonance signature for the sample from the nuclear quadrupole resonance measurement received by the back-end device;
    comparing the nuclear quadrupole resonance signature of the sample with nuclear quadrupole resonance signatures of known chemicals;
    generating a test report based on the comparison that identifies the sample; and
    wireless transmitting the test report to the front-end device or a mobile user device.

12. An integrated nuclear quadrupole resonance-based detection method comprising:
    attaching a swappable sample coil to an opening at a face of a front-end device of an integrated nuclear quadrupole resonance-based detection system;
    positioning a sample in or near a sample coil of the front-end device, wherein the front-end device has a hand-held form factor;
    tuning the sample coil to a resonant frequency of the sample by an impedance matching network;
    acquiring a nuclear quadrupole resonance measurement of the sample; and
    wirelessly communicating the acquired nuclear quadrupole resonance measurement to a back-end device of the integrated nuclear quadrupole resonance-based detection system.

13. The method of claim 12, wherein the impedance matching network comprises a swappable impedance matching network, the method further comprising attaching the swappable impedance matching network to the opening at the face of the front-end device.

14. The method of claim 12, further comprising:
    generating a nuclear quadrupole resonance signature for the sample from the nuclear quadrupole resonance measurement received by the back-end device;
    comparing the nuclear quadrupole resonance signature of the sample with nuclear quadrupole resonance signatures of known chemicals;
    generating a test report based on the comparison that identifies the sample; and
    wireless transmitting the test report to the front-end device or a mobile user device.

15. The method of claim 14, further comprising generating a nuclear quadrupole resonance signature for the sample from the nuclear quadrupole resonance measurement.

16. The method of claim 12, wherein the swappable sample coil comprises a cylindrical coil without a Faraday cage.

17. The method of claim 12, wherein the swappable sample coil is tuned over 1.5 MHz to 3 MHz for 14N nuclear quadrupole resonance measurements.

18. The method of claim 12, wherein the swappable sample coil is tuned over 20 MHz to 35 MHz for 35Cl nuclear quadrupole resonance measurements.

19. The method of claim 12, further comprising selecting between two output stages with different power handling capabilities based on an input signal received from the back-end device.

20. The method of claim 19, wherein the input signal comprises a differential square wave.

* * * * *